United States Patent
Kwon et al.

(10) Patent No.: US 9,373,788 B2
(45) Date of Patent: Jun. 21, 2016

(54) METHOD FOR FABRICATING SEMICONDUCTOR DEVICE

(71) Applicant: SK hynix Inc., Gyeonggi-do (KR)

(72) Inventors: Young Seok Kwon, Gyeonggi-do (KR); Kwon Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 147 days.

(21) Appl. No.: 14/185,427

(22) Filed: Feb. 20, 2014

(65) Prior Publication Data

US 2015/0147844 A1    May 28, 2015

(30) Foreign Application Priority Data

Nov. 28, 2013  (KR) .................. 10-2013-0146171

(51) Int. Cl.
| | | |
|---|---|---|
| H01L 21/06 | (2006.01) | |
| H01L 45/00 | (2006.01) | |
| C23C 16/30 | (2006.01) | |
| C23C 16/455 | (2006.01) | |

(52) U.S. Cl.
CPC ............ H01L 45/1616 (2013.01); H01L 45/06 (2013.01); H01L 45/1233 (2013.01); H01L 45/144 (2013.01); H01L 45/1683 (2013.01); C23C 16/305 (2013.01); C23C 16/45523 (2013.01)

(58) Field of Classification Search
CPC ............ H01L 45/144; H01L 45/1616; H01L 45/1233; H01L 45/1683; C23C 16/305; C23C 16/45523
See application file for complete search history.

(56) References Cited

U.S. PATENT DOCUMENTS

| | | | |
|---|---|---|---|
| 7,569,417 B2* | 8/2009 | Lee .................. | C23C 16/305 257/E31.027 |
| 2007/0048977 A1* | 3/2007 | Lee .................. | C23C 16/45523 438/483 |
| 2008/0108174 A1* | 5/2008 | Park ................. | C07F 7/30 438/102 |
| 2009/0075420 A1* | 3/2009 | Bae ................... | C23C 16/305 438/102 |
| 2009/0097305 A1* | 4/2009 | Bae ................... | C23C 16/305 365/163 |
| 2010/0248460 A1* | 9/2010 | Lee .................. | H01L 45/1616 438/494 |
| 2011/0180905 A1* | 7/2011 | Zheng ............... | C23C 16/305 257/616 |
| 2013/0183446 A1* | 7/2013 | Kawano .............. | C23C 16/305 427/252 |

FOREIGN PATENT DOCUMENTS

KR    1020100109163    10/2010

* cited by examiner

*Primary Examiner* — Marvin Payen
*Assistant Examiner* — Jeremy Joy
(74) *Attorney, Agent, or Firm* — IP & T Group LLP

(57) ABSTRACT

A method for fabricating a semiconductor device includes supplying a first source gas including a germanium (Ge) precursor onto a semiconductor substrate for a first time period, and periodically interrupting the supplying of the first source gas for the first time period to form Ge elements on the semiconductor substrate.

8 Claims, 4 Drawing Sheets

METHOD FOR FABRICATING SEMICONDUCTOR DEVICE

CROSS-REFERENCES TO RELATED APPLICATION

This application claims priority under 35 U.S.C. 119(a) to Korean application No. 10-2013-0146171, filed on Nov. 28, 2013, in the Korean intellectual property Office, which is incorporated by reference in its entirety as set forth in full.

BACKGROUND

1. Technical Field

Various embodiments of the inventive concept relate to a method for fabricating a semiconductor device, and more particularly, to a method for fabricating a phase-change random access memory (PCRAM) device having a confined structure.

2. Related Art

With trends toward miniaturization, low-power consumption, high performance, diversification, or the like of electronic apparatuses such as computers and portable apparatuses, semiconductor memory devices that may store information have been used in the electronic apparatuses, and researches on the semiconductor memory devices have actively progressed.

As one of the semiconductor memory devices, a semiconductor memory device may store data in a data storage layer with a switching characteristic between different resistance states in response to an applied voltage or current.

Examples of the semiconductor memory device with such characteristics includes resistive RAMs (RRAMs), PCRAMs, ferroelectric RAMs (FRAMs), magnetic RAMs (MRAMs), E-fuses, or the like.

The PCRAMs among the semiconductor memory devices use a phase-change material pattern as a data storage medium. The phase-change material pattern has two stable states (an amorphous state and a crystalline state) depending on applied heat, and the semiconductor memory devices having the phase-change material pattern store data using a resistance difference between the amorphous state and the crystalline state.

Generally, a widely known phase-change material GST (Ge—Sb—Te), which is a compound of germanium (Ge)-antimony (Sb)-tellurium (Te). The phase-change material pattern may be formed by supplying source gases (for example, a gas including a Ge precursor, a gas including a Sb precursor, and a gas including a Te precursor) together with a reaction gas to an inside of a process chamber in which a semiconductor substrate including a lower electrode is supported. The Ge precursor has a ligand larger than the Sb precursor or the Te precursor.

The semiconductor memory devices may have a confined structure to reduce a reset current. Referring to FIG. 1, Ge precursors are adsorbed to each other while the Ge precursors move to be formed on the semiconductor memory device having a confined structure, that is, in a hole 25 of an interlayer insulating layer 20 formed on a semiconductor substrate 10, and thus a molecular size is increased. In FIG. 1, the reference numeral 30 is a heater formed in the hole.

If the molecular size of the Ge precursors is increased as described above, a void may be formed as illustrated in FIG. 1 when the Ge precursors are placed in the hole 25, and thus Ge metal elements may not be deposited at a desired composition ratio.

SUMMARY

One or more exemplary embodiments are provided to a method for fabricating a semiconductor device capable of smoothly forming a phase-change material pattern at a desired composition ratio even in a confined structure.

According to an exemplary embodiment, there is provided a method for fabricating a semiconductor device. The method may include supporting a semiconductor substrate in a process chamber, supplying a first source gas including a germanium (Ge) precursor to the process chamber for a first time period a id periodically interrupting the supplying of the first source gas for the first time period to form Ge elements on the semiconductor substrate. According to another exemplary embodiment, there is provided a method for fabricating a semiconductor device. The method may include forming a lower electrode on a semiconductor substrate, forming an interlayer insulating layer having a hole on the semiconductor substrate including the lower electrode, forming a phase-change material pattern in the hole by supplying first to third source gases including antimony (Sb), tellurium (Te), and germanium (Ge) precursors, respectively, to the hole and forming an upper electrode on the semiconductor substrate including the phase-change material pattern, wherein the supplying of the third source gas includes periodically repeating supply of the third source gas and interruption of the supply of the third source gas.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more dearly understood from the following detailed description taken in conjunction with the accompanying drawings, in which.

DETAILED DESCRIPTION

Figure 1:
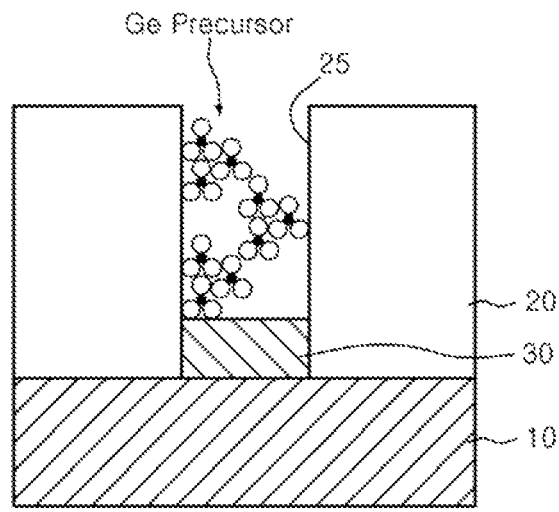
FIG. 1 is a view illustrating a process of forming Ge elements in a conventional semiconductor device.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

Figure 2:
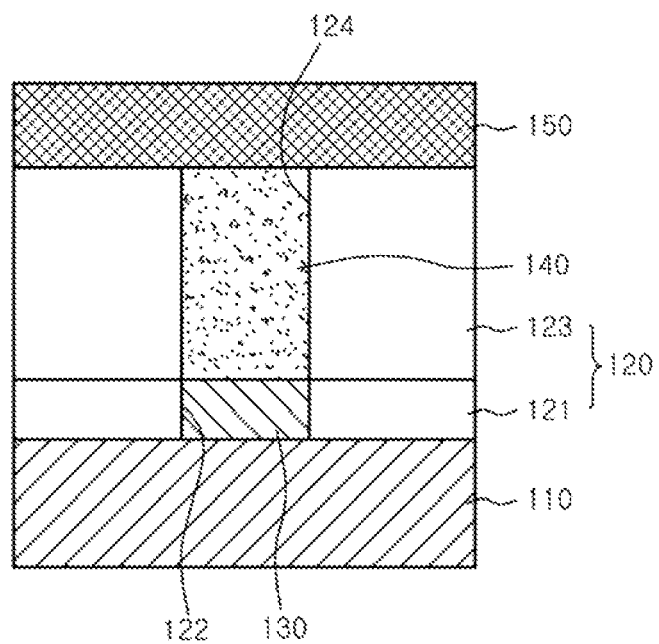
FIG. 2 is a view illustrating a semiconductor device according to an embodiment of the inventive concept.
Figure 3:
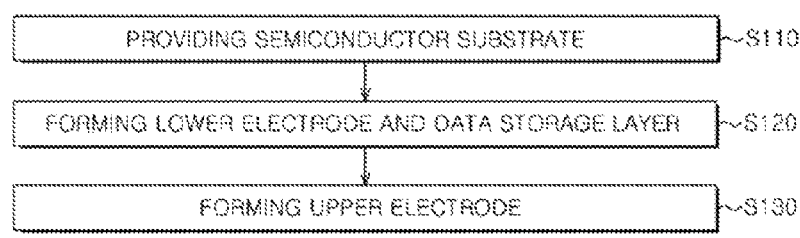
FIG. 3 is a flowchart illustrating a method of fabricating the semiconductor device according to the embodiment of the inventive concept.
Figure 4:
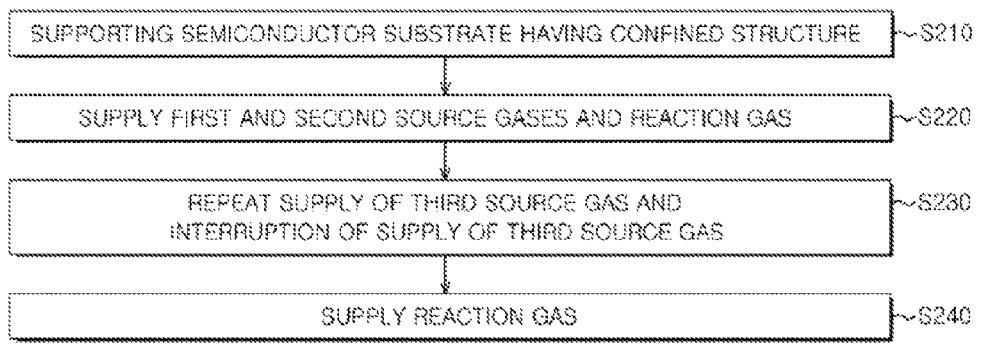
FIG. 4 is a flowchart illustrating a process of forming a data storage layer of the semiconductor device according to the embodiment of the inventive concept.

Referring to FIGS. 2 and 3, to fabricate a semiconductor device, first, a semiconductor substrate 110 including a switching device (not shown) is provided (S110).

A lower electrode (for example, a heater 130) and a data storage layer (for example, a phase-change material pattern 140) are sequentially formed on the semiconductor substrate 110 (S120).

In the above-described process, a first interlayer insulating layer 121 may be formed on the semiconductor substrate 110 and etched to form a first hole 122, and then the heater 130 may be formed in the first hole 122. The heater 130 may be formed of a material having high electrical conductivity and high thermal conductivity, for example, a titanium (Ti)-based alloy such as TiW, TiAlN, TIN, or TiSiN or a metal such as tungsten (W).

A second interlayer insulating layer 123 may be formed on the semiconductor substrate 110 including the heater 130 and etched to form a second hole 124 corresponding to the first hole 122, and then the phase-change material pattern 140 may be formed in the second hole 124. The phase-change material pattern 140 may include a chalcogenide-based material such as GST (Ge—Sb—Te), and may be formed by an atomic layer deposition (ALD) method.

An upper electrode 150 is formed on the semiconductor substrate 110 including the heater 130 and the phase-change material pattern 140 (S130). The upper electrode 150 may be formed of a conductive material, for example, a metal such as W, titanium (Ti) or tantalum (Ta), polysilicon, a metal silicide such as tungsten silicide, or the like, A process of forming the phase-change material pattern 140 in the fabricating method of the semiconductor device will be described in detail.

Referring to FIGS. 4 to 7, the semiconductor substrate 110, in which the second interlayer insulating layer 123 having the confined structure, that is, the second hole 124, is formed, is supported in a process chamber 210 (S210).

A first source gas G1 and a second source gas G2 are supplied to the process chamber 210 for a first time period T1 (S220). At this time, the first source gas G1 may be a gas including a Sb source (for example, a precursor including an organometallic compound containing Sb), and the second source gas G2 may be a gas including a Te source (for example, a precursor including an organometallic compound containing Te).

The Sb source may be any one selected from the group including $Sb(CH_3)_3$, $Sb(C_2H_5)_3$, $Sb(C_3H_7)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$, $Sb(N(Si(CH_3)_3)_2)_3$, and a combination thereof.

The Te source may be any one selected from the group including $Te(CH_3)_2$, $Te(CH(CH_3)_2)$, $Te(C_2H_5)_2$, $Te(n-C_3H_7)_2$, $Te(i-C_3H_7)_2$, $Te(C_4H_9)$, $Te(t-C_4H_9)_2$, $Te(i-C_4H_9)_2$, $Te(CH_2=CH_2)_2$, $Te(N(Si(CH_3)_3)_2)_2$, and a combination thereof.

When the first source gas G1 and the second source gas G2 are supplied to the process chamber 210, a reaction gas G4, which may reduce the precursors of the source gases G1 and G2, may be supplied for a time Ta. The reaction gas G4 may include any one selected from the group including $H2$, $NH_3$, $N_2H_4$, $SiH_4$, $B_2H_6$, $O_2$, $H_2O$, and a combination thereof.

The supply of the reaction gas G4 may be performed substantially similarly to the supplies of the first and second source gases G1 and G2. The reaction gas G4 may be supplied from before the supplies of the first and second source gases G1 and G2 and the reaction gas G4 may also be supplied after interruption of the supplies of the first and second source gases G1 and G2 like in the embodiment described below.

Next, when a certain time elapses after the first and second source gases G1 and G2 are supplied for the first time period T1, a third source gas G3 is supplied to the process chamber 210 for a second time period T2 (S230). A purge gas G5 may be supplied after the reaction gas G4 is applied before the supply of the third source gas G3. The purge gas G5 may include a nitrogen gas or an inert gas. The third source gas G3 may include a gas including a Ge source (for example, a precursor including an organometallic compound containing Ge).

Figure 7:
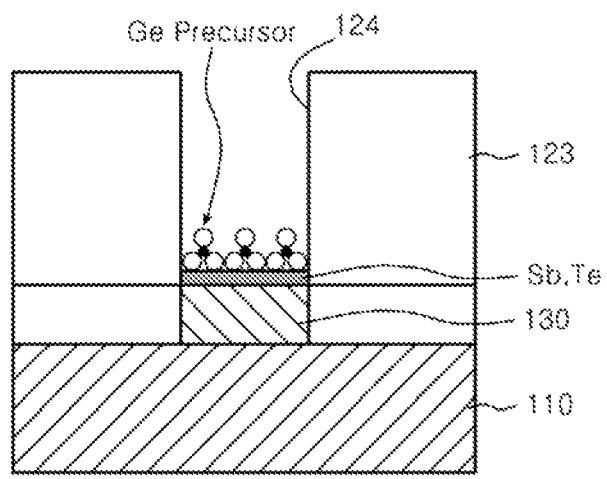
FIG. 7 is a view illustrating a process of forming Ge elements in the fabricating method of the semiconductor device according to the embodiment of the inventive concept.

In FIG. 7, "Sb" and "Te" are metal elements, i.e., antimony and tellurium, deposited on the heater 130 through the supplies of the first and second source gases.

The Ge source may be any one selected from the group including $Ge(CH_3)_4$, $Ge(C_2H_5)_4$, $Ge(n-C_4H_9)_4$, $Ge(i-C_4H_9)_4$, $Ge(C_6H_5)_4$, $Ge(CH_2=CH)_4$, $Ge(CH_2CH=CH_2)_4$, $Ge(CF_2=CF)_4$, $Ge(C_6H_5CH_2CH_2CH_2)_4$, $Ge(CH_3)_3(C_6H_5)$, $Ge(CH_3)_3(C_6H_5CH_2)$, $Ge(CH_3)_2(C_2H_5)_2$, $Ge(CH_3)_2(C_6H_5)_2$, $GeCH_3(C_2H_5)_3$, $Ge(CH_3)_3(CH=CH_2)$, $Ge(CH_3)_3(CH_2CH=CH_2)$, $Ge(C_2H_5)_3(CH_2CH=CH_2)$, $Ge(C_2H_5)_3(C_5H_5)$, $Ge(CH_3)_3H$, $Ge(C_2H_5)_3H$, $Ge(C_3H_7)_3H$, $Ge(i-C_3H_7)H_3$, $Ge(C_4H_9)_3H$, $Ge(t-C_4H_9)H_3$, $Ge(N(CH_3)_2)_4$, $Ge(N(CH_3)(C_2H_5))_4$, $Ge(N(C_2H_5)_2)_4$, $Ge(N(i-C_3H_7)_2)_4$, $Ge(N(Si(CH_3)_3)_2)_4$, and a combination thereof.

In the above-described process, the third source gas G3 is not consistently supplied for the second time period T2. In other words, the supply of the third source gas G3 and interruption of the supply of the third source gas G3 are repeated for the second time period T2. Preferably, the supply of the third source gas G3 and the interruption of the supply of the third source gas G3 are repeated at a cycle of 10 to 300 msec.

The second time period T2 may be a time sufficient to deposit the Ge metal elements at a desired composition ratio. For example, the second time period T2 may be longer than a time required for forming the phase-change material pattern by consistently supplying the third source gas G3.

Figure 5:
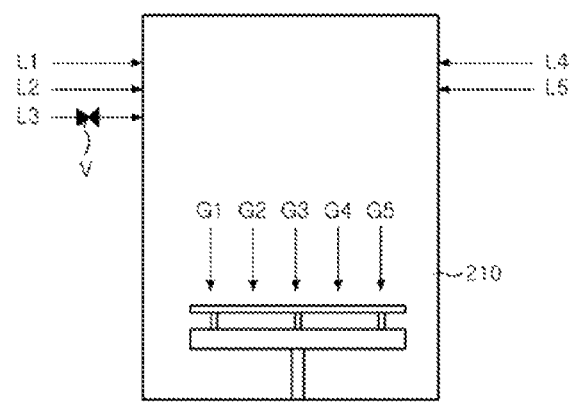
FIG. 5 is a schematic diagram illustrating fabricating equipment for performing the process of forming the data storage layer of the semiconductor device according to the embodiment of the inventive concept.
Figure 6:
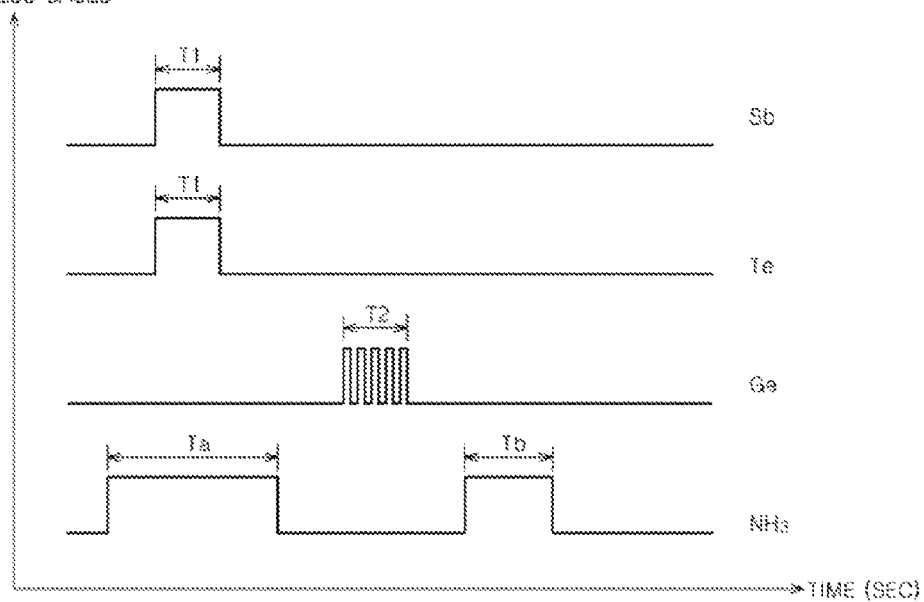
FIG. 6 is a waveform diagram explaining pulses of process gases in the fabricating method of the semiconductor device according to the embodiment of the inventive concept.

The supply of the third source gas G3 and the interruption of the supply of the third source gas G3 may be controlled through opening/closing of a valve V installed in a pipe L3 through which the third source gas G3 is supplied. In FIG. 5, the references L1, L2, L4, and L5 may be pipes, which supply the first and second source gases, the reaction gas, and the purge gas to the process chamber 210.

The Ge precursors are adsorbed to each other while moving in the process of depositing the Ge metal elements, and thus the molecular size of the Ge precursors is increased. Thus, the Ge metal elements may not be deposited at a desired composition ratio in a space for the phase-change material pattern to be formed, that is, in the second hole 124.

However, in the embodiment, the supply of the third source gas G3 and the interruption of the supply of the third source gas G3 are periodically repeated, and thus the Ge precursors are may not adsorb to a certain size or more. Therefore, a void, which is generated due to the moving of the Ge precursors having a certain size or more, is not formed in the second hole 124.

A reaction gas G4 is supplied to the process chamber 210 for a time Tb (S240). That is, in the embodiment, the Ge elements may be deposited at a desired composition ratio on the semiconductor device having the confined structure. A purge gas G5 may be supplied after the supply of the reaction gas G4. The purge gas G5 may include a nitrogen gas or an inert gas like the purge gas supplied in the above-described process.

In the above-described processes, radio frequency (RF) plasma power may be applied to the process chamber 210 without a break.

Therefore, when the sequences S220 to S240 including the above-described processes are repeatedly performed, the phase-change material pattern may be smoothly formed in the confined structure.

In particular, since the Ge precursors having a ligand larger than the Sb precursors and the Te precursors may not adsorb to a certain molecular size or more during the moving of the Ge precursors, and thus the Ge elements may be easily deposited in the confined structure.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for fabricating a semiconductor device, the method comprising:
   supplying a first source gas including a germanium (Ge) precursor onto a semiconductor substrate for a first time period; and
   periodically interrupting the supplying of the first source gas for the first time period to form Ge elements on the semiconductor substrate,
   wherein the periodically interrupting the supplying of the first source gas is repeated at a cycle of 10 to 300 msec for the first time period.

2. The method of claim 1, further comprising, before the supplying of the first source gas:
   forming an interlayer insulating layer having a hole on the semiconductor substrate,
   wherein the Ge precursor is deposited to form the Ge elements in the hole.

3. The method of claim 1, further comprising, before the supplying of the first source gas:
   supplying a second source gas including an antimony (Sb) precursor and a third source gas including a tellurium (Te) precursor and a reaction gas for reaction of the second and third source gases onto the semiconductor substrate.

4. The method of claim 3, further comprising, after the supplying of the first source gas:
   supplying the reaction gas for reaction of the first source gas.

5. The method of claim 4, wherein the reaction gas includes an $NH_3$ gas.

6. A method for fabricating a semiconductor device, the method comprising:
   forming a lower electrode on a semiconductor substrate;
   forming an interlayer insulating layer having a hole on the semiconductor substrate including the lower electrode;
   forming a phase-change material pattern in the hole by supplying first to third source gases including antimony (Sb), tellurium (Te), and germanium (Ge) precursors, respectively, to the hole; and
   forming an upper electrode on the semiconductor substrate including the phase-change material pattern,
   wherein the supplying of the third source gas includes periodically repeating the supply of the third source gas and the interruption of the supply of the third source gas at a cycle of 10 to 300 msec.

7. The method of claim 6, wherein the forming of the phase-change material pattern includes:
   supplying the first and second source gases and a reaction gas for reaction of the first and second source gases to the hole;
   supplying the third source gas, after the supplying of the first and second gases and the reaction gas;
   supplying the reaction gas for reaction of the third source gas, after the supplying of the third source gas.

8. A method for depositing a phase change layer in a phase change space, the method comprising:
   supplying an antimony (Sb) source and a tellurium (Te) source to the phase change space, for a first time period, without interrupting, respectively; and
   supplying a germanium (Ge) source to the phase change space, for a second time period, with a plurality of interrupting, after supplying the Sb source and Te source.

* * * * *